United States Patent [19]

Conru et al.

[11] Patent Number: 6,002,164
[45] Date of Patent: Dec. 14, 1999

[54] SEMICONDUCTOR LEAD FRAME

[75] Inventors: H. Ward Conru; Stephen George Starr, both of Essex Junction, Vt.

[73] Assignee: International Business Machines Corporation, Armonk, N.Y.

[21] Appl. No.: 08/296,269

[22] Filed: Aug. 25, 1994

Related U.S. Application Data

[63] Continuation of application No. 07/951,292, Sep. 9, 1992, abandoned.

[51] Int. Cl.$^6$ .................................................. H01L 23/48
[52] U.S. Cl. ........................ 257/666; 257/667; 257/676; 257/691; 257/692; 257/693; 257/695
[58] Field of Search .................................. 257/666, 691, 257/692, 693, 695, 667, 676

[56] References Cited

U.S. PATENT DOCUMENTS

| | | | |
|---|---|---|---|
| 4,711,700 | 12/1987 | Cusack | 257/666 |
| 4,862,245 | 8/1989 | Pashby et al. | 257/666 |
| 5,164,815 | 11/1992 | Lim | 257/666 |

FOREIGN PATENT DOCUMENTS

| | | | |
|---|---|---|---|
| 63-283053 | 5/1987 | Japan | 257/666 |
| 62-232147 | 10/1987 | Japan | 257/676 |

*Primary Examiner*—Carl Whitehead, Jr.
*Attorney, Agent, or Firm*—Thornton & Thornton; Francis J. Thornton; Robert J. Walsh

[57] ABSTRACT

A lead frame having a plurality of metallic conductors with each conductor having a coined or stamped region near its proximal end but spaced therefrom to provide pressure points to assure substantial even joining of the conductor to semiconductor chip via an insulative adhesive medium. The lead frame, when mounted on the active face of a semiconductor chip, has wires connecting terminals on the major active surface of the semiconductor chip to the bands on selected lead frame conductors. The lead frame on the semiconductor chip and the wires which connect the semiconductor chip terminals to the bands of selected lead frame conductors are then encapsulated with a suitable insulative material to form a semiconductor module or package.

7 Claims, 3 Drawing Sheets

SEMICONDUCTOR LEAD FRAME

This is a continuation of application Ser. No. 07/951,292 filed on Sep. 9, 1992 now abandoned.

BACKGROUND OF THE INVENTION

1. Field of the Invention

This invention relates to an improved conductor assembly comprising uniquely formed lead frame conductors used to attach a semiconductor chip to a socket or pc board. Each lead frame conductor of the invention has one end coined to form a land or wire bonding area and each is arranged to extend over and be joined to the surface of a chip.

2. Description of the Prior Art

U.S. Pat. No. 4,862,245 assigned to the same assignee as the present invention describes a technique for positioning and fixing leads to a semiconductor chip prior to encapsulation of the chip in a protective coating by extending the lead frame over the surface of the chip.

During the forming operation for creating the lead frames used with such encapsulated devices the surface of the lead frame fingers become crowned, i.e. the covers become quite rounded, and hemispherical. It has been found that it is difficult to bond wires to these crowned surfaces. Thus, during the operation where wires are being bonded between the pads on the chip and the lead frame as taught in U.S. Pat. No. 4,862,245, defects can occur.

It is an object of this invention to provide an improved lead frame conductor with an improved land or wire bonding area thereon.

It is a further object to create an improved lead frame conductor that can be fully joined to an insulative layer.

A further object of the invention is to provide a plastic encapsulated semiconductor package which when connected with lead frame members provided with improved lands or wire bonding areas has enhanced electrical and thermal coupling between the underlying semiconductor chip and the lead frame as well as improved mechanical interlocking of the lead frame to the encapsulant.

These and other objects of the present invention are provided by a lead frame provided with improved lands for contacts to a semiconductor chip. The lead frame comprises a plurality of figured conductors in which the proximal end of each conductor is arranged in a desired pattern having fixed spacing and is provided with a land region suitable for bonding wires extending from a semiconductor chip thereto. The distal ends of the conductors fan out into a selected configuration and are adapted to connect with electrical voltage and external signal and voltage lines.

These and other objects, features and advantages of the invention will become more apparent from the following particular description of the preferred embodiment of the invention as illustrated in the accompanying drawings.

DESCRIPTION OF THE DRAWINGS

FIG. 1 is an exploded representation of one embodiment of the present invention showing the spacial relationship between the chip, the insulative layer and the lead frame assembly of the present invention.

DESCRIPTION OF THE PREFERRED EMBODIMENT

Figure 4:
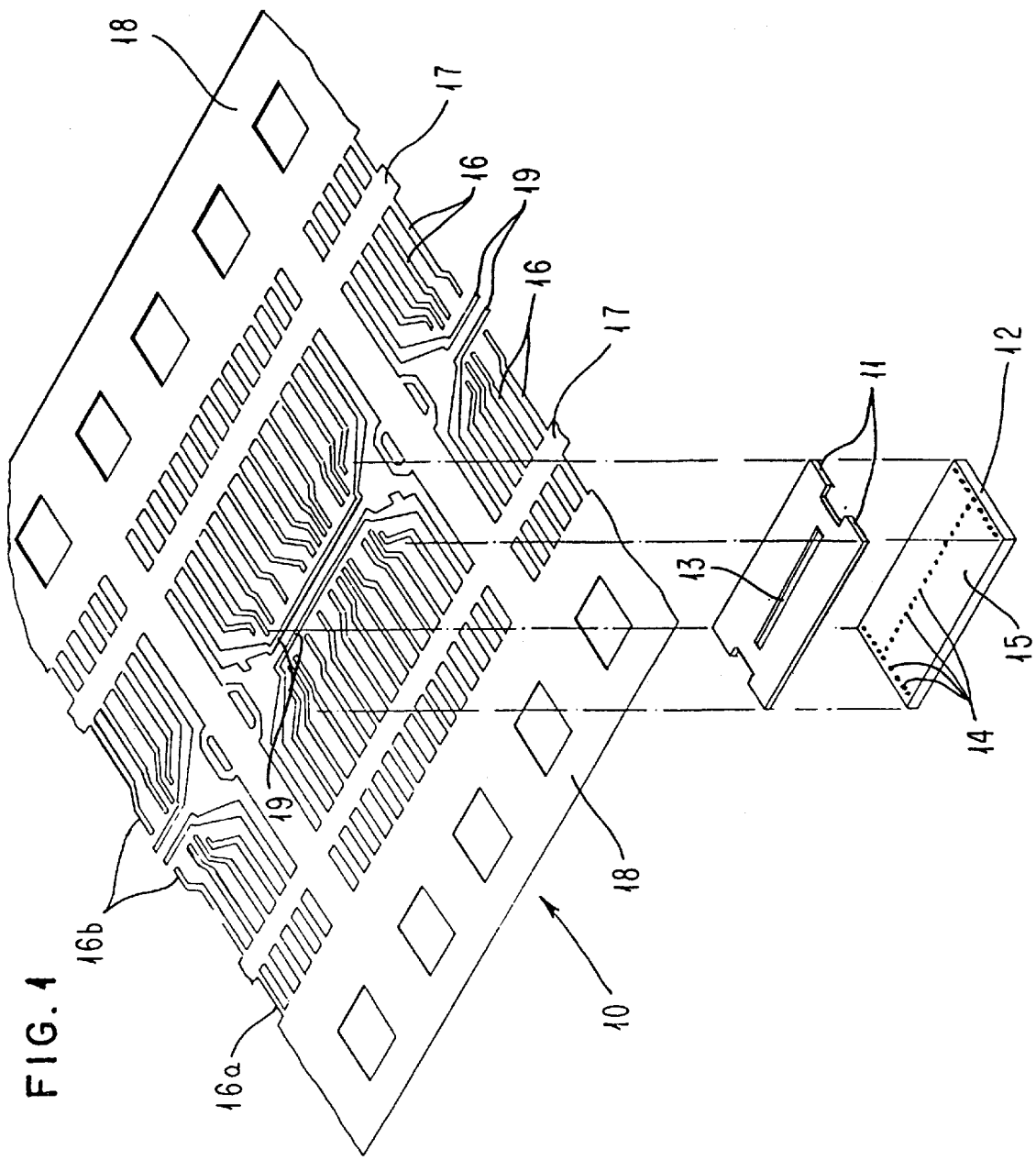
FIG. 4 is a partial sectional view of lead frame fingers coined in accordance with the preferred embodiment of the present invention showing the lead frame fingers during bonding of the lead frame via the insulative layer to the surface of a semiconductor chip by a thermode.

FIG. 1 is an exploded view of one embodiment of the invention and shows the spacial relationship of the lead frame 10, a shaped insulating layer 11 and a semiconductor chip 12 arranged to be bonded together. The lead frame 10 is produced from metal sheet stock and is provided with a plurality of conductors 16 whose distal ends 16a are held in place by cross bars 17 and selvage strips 18. The proximal ends 16b of the conductors float free. The outmost conductors on each side of the lead frame can be interconnected by extended bus bars 19. These bus bars are arranged to be generally parallel to the centrally disposed row of chip pads 14. The sheet stock in which the lead frame is formed is preferably copper or aluminum although other alloys or metals are readily used in the art. The term lead frame as used herein is well known in the art and the material thicknesses, strength, etc. of such lead frames is well known and the use of this term lead frame is all that is necessary to purchase such items from a number of commercial sources. In the art, the term lead frame means a metal structure formed from metal sheet stock and of a sufficient size and strength to meet specific mechanical strength requirements. Typically, the conductors extending from the package for using such a lead frame are 0.008 to 0.008 inches thick and approximately 0.008 to 0.015 inches wide and of such strength as to be successfully put into a socket or secured to surface mounted printed circuit boards without distortion and without buckling due to slight misalignment. Such lead frames are extensively used and known in the semiconductor integrated circuit art and manufactured by a number of commercial suppliers.

Figure 3:
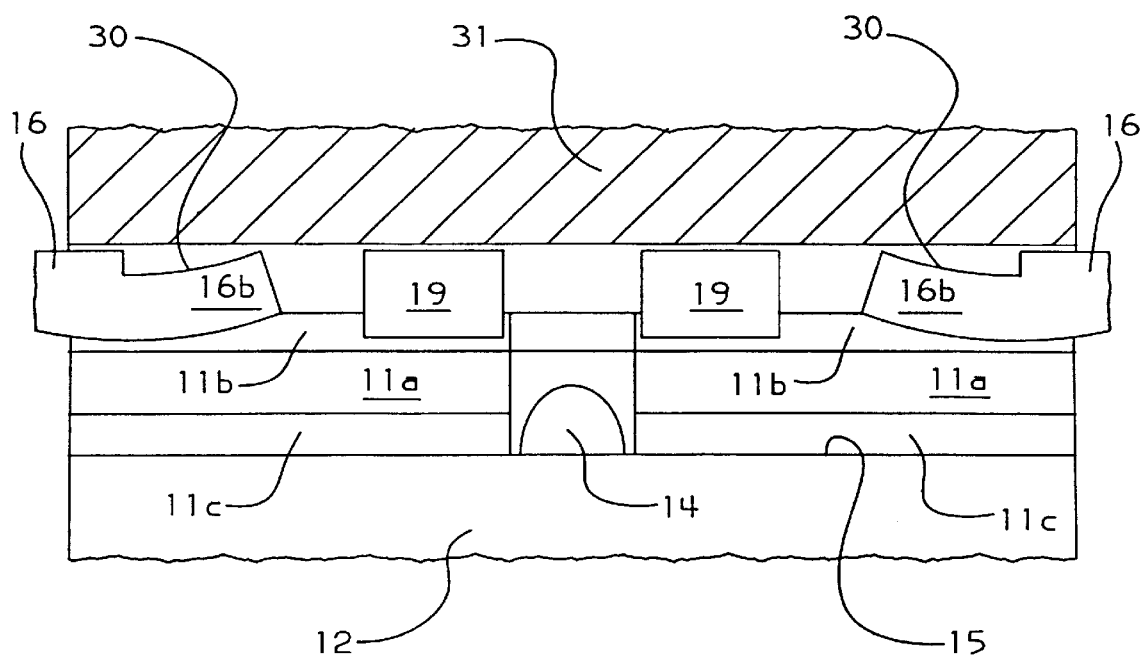
FIG. 3 is a partial sectional view of lead frame conductors or fingers which have been coined on their very tips showing the lead frame fingers during bonding of the lead frame via the insulative layer to a semiconductor chip surface by a thermode.
Figure 4:
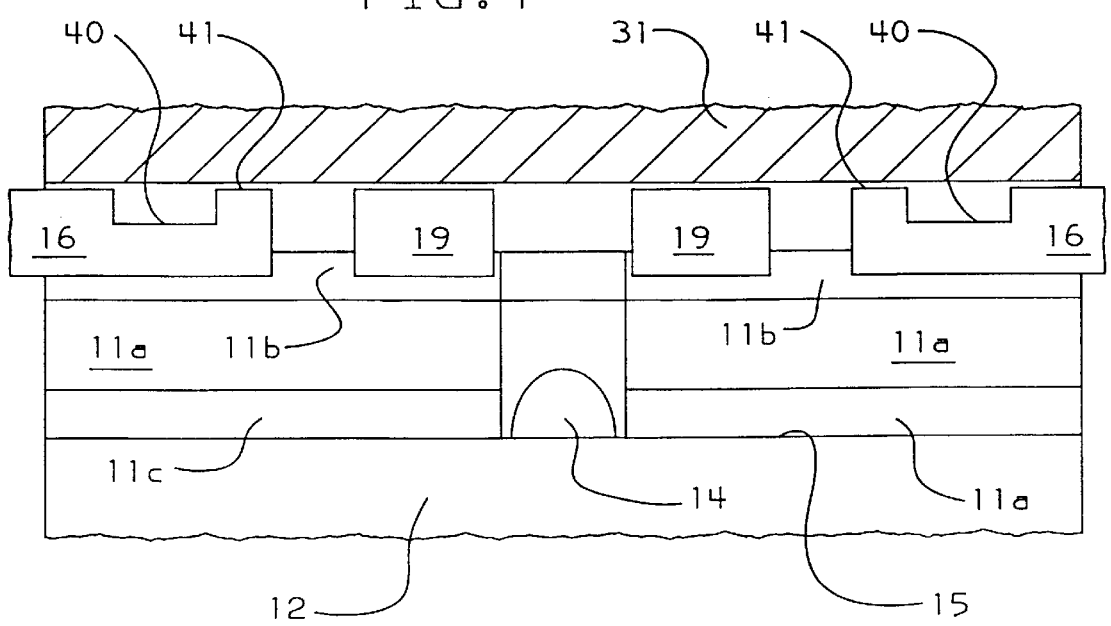

The insulating layer 11 can be a single piece, as shown, with a centrally deposed opening 13 or can be made in as two separated lobes as shown in U.S. Pat. No. 4,862,245. This insulating layer 11 as shown in FIGS. 3 and 4 typically is formed of an insulative backing or film usually a 0.001 inch thick polyimide film 11a coated on both sides with 0.0008 inch thick adhesive layers 11b and 11c. The film should have a melting temperature above 275° C. and not contain ionizable species such as halides or active metals such as sodium. One such polyimide suitable for such a purpose is sold by E. I. DuPont De Nemours & Co. under the tradename KAPTON.

Suitable adhesives are butyral phenolic, an epoxy, or an acrylic.

The chip 12 has a centrally arranged row of pads 14 on a face 15 thereof. Additional pads can be arranged on the extreme ends of the chip as shown.

Figure 2:
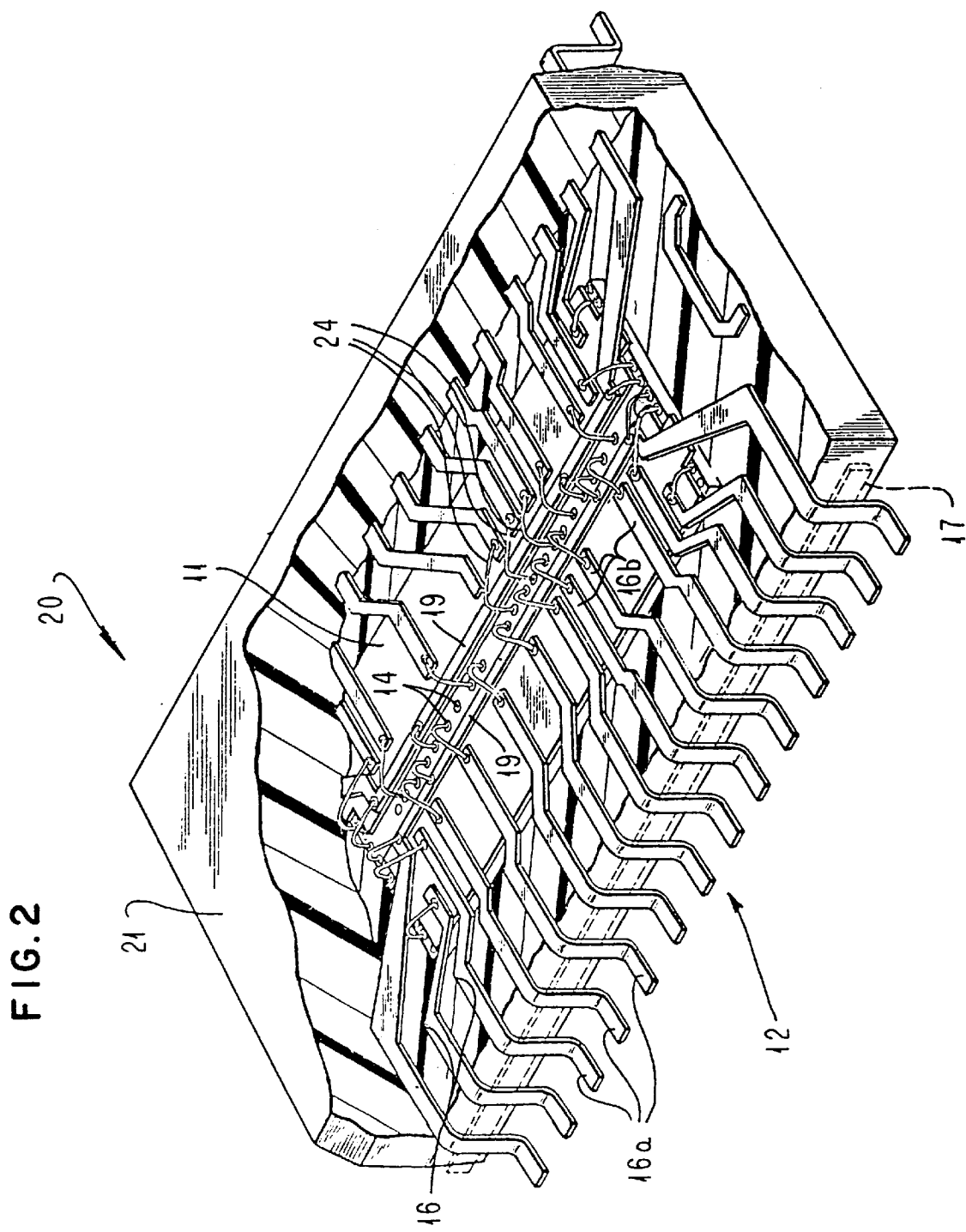
FIG. 2 is a partially broken away view of a semiconductor chip, having the lead frame of the present invention; mounted on a major face thereof.

FIG. 2 shows a completed package 20 employing the present invention in which part of the encapsulating material 21 has been removed for clarity and to show the internal construction and arranging of the lead frame 10, insulator 11 and semiconductor chip 12 after assembly. After encapsulation the lead frame selvage strips 18 and the cross bars 17 shown in FIG. 1 are removed and the distal ends 16a of conductors 16 which extend beyond the package may be formed as required.

As will be shown in greater detail in FIG. 3, the proximal ends 16b of the lead frame conductors, which are adjacent to the bonding pads on the semiconductor chip, are formed or coined to provide lands of uniform area and thicknesses to provide better bonding areas for the gold wires 24, connected between the chip pads 14, and the leads 16.

One embodiment of the coined lands on the proximal ends 16b is shown in greater detail in FIG. 3. In this FIG. 3, the extreme ends 16b of the lead frame conductor 16 are stamped to form uniformly flat lands 30 for the wire bond attachments. The stamping or coining operation causes the proximal end 16b of each lead 16 to be substantially reduced to a thickness which can be up to one-half of the original thickness of the lead. Once the ends 16b of each lead 16 is so stamped or coined the lead frame conductors 16 and the bus bars 19 are bonded to the major face 15 of the underlying semiconductor chip 12. This is accomplished by placing the adhesive coated insulative film 11a between the lead frame and the chip and then positioning a thermode 31 over the assembly comprising the chip 12, the coated insulator 11, and the lead frame conductor 16 and forcing the lead frame conductors 16 and the bus bars 19 into the upper adhesive surface 11b.

The thermode 31 heats and applies pressure to the lead frame conductor 16. The pressure and heat applied by the thermode partially melts the underlying adhesive layers 11a and 11b beneath the lead frame conductors and causes the film to bond to the lead frame and the chip surface 15. As the adhesive layer 11b melts beneath the conductors 16 they, the conductors, are forced into the upper adhesive layer 11a. When a thermode such as is shown in FIG. 3 is used the coined tips of the leads 16 are not in direct contact with the thermode and they can become bent upwards by the force of the underlying adhesive as shown in FIG. 3. Such deformed bond areas causes problems when the wires 24 are bonded thereto. Specifically, the bending and distortion of these lands is a direct cause of wire bond yield loss and poor wire bond reliability. These deformed lands are not desirable.

FIG. 4 shows the preferred embodiment of the present invention and depicts in cross section lead frame conductors 16 which are coined to provide bonding lands 40 separated from the extreme tip of the conductors 16 by small islands 41 of uncoined material, so that flat thermodes can be used to bond the lead frame conductors to the surface of the chip via the layers 11, 11a and 11b without encountering the bending and distortion of the tips of the leads as was discussed in conjunction with FIG. 3 above.

In FIG. 4, the lead frame conductors 16 have formed near its proximal end coined lands 40 which are spaced from the extreme tips of each lead frame conductor 16 by a small island 41 of uncoined material. These islands retain their original thickness and thus when the thermode 31 is brought into contact with the lead frame conductors 46, the thermode 31 will heat and apply the same pressure to the tips of the lead frame conductors 46 as it applies to the remainder of each lead frame conductor so as to evenly force the entire length of each lead frame conductor into the adhesive layer 11b. These islands 48 thus provide pressure points to assure that the thermode 31 applies to each lead frame tip, sufficient pressure and heat such that bending of the tip or the coined lands does not occur.

While the novel features of this invention have been described in terms of the preferred embodiment and particular application it should be appreciated that various admissions and substitutions in form may be made by those skilled in the art without departing from the spirit and scope of the invention. It should be obvious to one skilled in the art that various arrangements and combinations can be created utilizing the concepts set forth in the invention and it is therefore requested that the present invention be limited only by the appended claims, wherein

We claim:

1. An encapsulated semiconductor module comprising:
   a semiconductor chip having a major surface with terminals thereon disposed within an encapsulated material;
   a lead frame comprising a plurality of self supporting unitary, discrete, and continuous lead frame conductive fingers, formed of metal sheet stock extending over said major surface of said chip at spaced locations from said terminals,
   the proximal end of said conductive fingers arranged in a fixed spacing and provided with a coined bonding region adapted to provide a wire bond contact area, and
   the distal ends of said conductive fingers fanning out from said chip and said encapsulating material, and adapted to connect with signal and voltage lines,
   characterized by the coined bonding region on each of said proximal ends, of said fingers, being separated from the tip of the proximal end of said fingers by an uncoined region, and
   discrete electrical wire means bonded to the coined bonding regions on said conductive fingers and said terminals and electrically connecting said conductors to said terminals.

2. An encapsulated semiconductor module comprising:
   a semiconductor chip having terminals thereon disposed within an encapsulating material;
   a lead frame comprising a plurality of self supporting unitary, discrete, and continuous lead frame conductors, and formed of metal sheet stock, extending over said chip and positioned to avoid contact with said terminals,
   the proximal ends of said conductors arranged in a fixed spacing, adjacent said terminals and each proximal end is provided with a coined bonding region adapted to provide contacts to the semiconductor chip,
   the distal ends of said conductors fanning out from said chip and cantilevered out of the encapsulated material, and adapted to connect with signal and voltage lines,
   characterized by the coined bonding region on each of said proximal ends, of said conductors, being separated from the tip of the proximal end of said conductors by an uncoined region,
   electrically insulating material disposed between said chip and said plurality of lead frame conductors, and attached to said plurality of lead frame conductors and to said semiconductor chip, and
   discrete electrically conducting wire means bonded to a coined bonding region on a conductor and to respective terminal on said chip to electrically connect the conductor to the terminal.

3. The module of claim 2 wherein said insulating material comprises a polyimide film coated with adhesive layers.

4. The module of claim 2 wherein there is further provided said lead frame linear bus bar parallel to said chip terminals and lying between said proximal ends of said conductors on said terminals.

5. The module of claim 4 wherein said bus bars are provided with coined bonding regions.

6. An encapsulated semiconductor module comprising:
   a semiconductor chip having terminals thereon disposed within an encapsulating material;

a lead frame comprising a plurality of self supporting unitary, discrete, and continuous lead frame conductors, formed of metal sheet stock of a selected thickness, extending over said chip and positioned to avoid contact with said terminals, the proximal ends of said conductors arranged in a fixed spacing, adjacent said terminals and each proximal end is provided with a bonding region, having a thickness less than said selected thickness, adapted to provide contacts to the semiconductor chip, the distal ends of said conductors fanning out from said chip and cantilevered out of the encapsulated material, and adapted to connect with signal and voltage lines, characterized by the bonding region on each of said proximal ends, of said conductors, being positioned between regions of said selected thickness, electrically insulating material disposed between said chip and said plurality of lead frame conductors, and attached to said plurality of lead frame conductors and to said semiconductor chip, and discrete electrically conducting wire means bonded between respective bonding regions on respective conductors and respective terminals on said chip to electrically connect said respective conductors to said respective terminals.

7. An encapsulated semiconductor module comprising;

a semiconductor chip having a major surface with terminals thereon disposed within an encapsulating material, a lead frame comprising a plurality of self supporting unitary, discrete, and continuous lead frame conductive fingers formed of metal sheet stock of a selected thickness extending over said major surface of said chip at spaced locations from said terminals, the proximal end of said conductive fingers arranged in a fixed spacing and provided with a bonding region having a thickness less than said selected thickness and adapted to provide a wire bond contact area, and the distal ends of said conductive fingers fanning out from said chip and said encapsulating material, and adapted to connect with signal and voltage lines, characterized by the bonding region on each of said proximal ends, of said fingers, being positioned between regions of said selected thickness, and discrete electrical wire means bonded to respective ones of said bonding regions on respective ones of said conductive fingers and respective ones of said terminals to electrically connect said respective ones of said conductors to respective ones of said terminals.

* * * * *